(12) United States Patent
Bouhamame et al.

(10) Patent No.: US 9,246,453 B2
(45) Date of Patent: Jan. 26, 2016

(54) TUNABLE RF FILTER

(75) Inventors: Mohamed Bouhamame, Swindon (GB); Luca Lococo, Anisy (FR); Sebastien Robert, Emieville (FR)

(73) Assignee: NXP, B.V., Eindhoven (NL)

( * ) Notice: Subject to any disclaimer, the term of this patent is extended or adjusted under 35 U.S.C. 154(b) by 1273 days.

(21) Appl. No.: 12/678,507

(22) PCT Filed: Sep. 15, 2008

(86) PCT No.: PCT/IB2008/053721
§ 371 (c)(1),
(2), (4) Date: Mar. 17, 2010

(87) PCT Pub. No.: WO2009/037625
PCT Pub. Date: Mar. 26, 2009

(65) Prior Publication Data
US 2010/0201437 A1 Aug. 12, 2010

(30) Foreign Application Priority Data
Sep. 20, 2007 (EP) .................................... 07291121

(51) Int. Cl.
*H03K 5/00* (2006.01)
*H03F 3/50* (2006.01)
(Continued)

(52) U.S. Cl.
CPC .. *H03F 3/50* (2013.01); *H03F 1/26* (2013.01); *H03F 1/32* (2013.01); *H03F 1/34* (2013.01); *H03F 1/56* (2013.01); *H03F 3/195* (2013.01); *H03F 3/45475* (2013.01); *H03G 5/14* (2013.01); *H03H 11/1213* (2013.01);
(Continued)

(58) Field of Classification Search
CPC ...................................... H03F 3/50; H03F 1/26
USPC .................................. 327/551–559, 336–337
See application file for complete search history.

(56) References Cited

U.S. PATENT DOCUMENTS 3,233,125 A * 2/1966 Buie .............................. 326/129
3,550,027 A * 12/1970 Uetrecht ....................... 330/291
(Continued)

FOREIGN PATENT DOCUMENTS

EP 0086026 A2 8/1983
EP 0696104 A1 2/1996
(Continued)

OTHER PUBLICATIONS

Geiger, R. L., et al; "Active Filter Design Using Operational Transconductance Amplifiers: A Tutorial"; IEEE Circuits and Devices; vol. 1; p. 20-32; Mar. 1985.

*Primary Examiner* — Dinh Le

(57) ABSTRACT

A tunable RF filter, comprising: an emitter follower stage (2); and a common emitter stage (4); the common emitter stage (4) providing feedback to the emitter follower stage (2). The common emitter stage (4) may comprise a first transistor (Ti) being the only transistor of the common emitter stage (4); and the emitter follower stage (2) may comprise a second transistor (T2) being the only transistor of the emitter follower stage (2). A further tunable RF filter provides improved linearity, comprising: an emitter follower stage (22); a joint common emitter and emitter follower stage (24); and a gain stage (26); a common emitter output of the joint common emitter and emitter follower stage (24) providing feedback to the emitter follower stage (22), and an emitter follower output of the joint common emitter and emitter follower stage (24) providing an input to the gain stage (26).

12 Claims, 4 Drawing Sheets

(51) Int. Cl.
*H03F 1/26* (2006.01)
*H03F 1/32* (2006.01)
*H03F 1/34* (2006.01)
*H03F 1/56* (2006.01)
*H03F 3/195* (2006.01)
*H03F 3/45* (2006.01)
*H03G 5/14* (2006.01)
*H03H 11/12* (2006.01)

(52) U.S. Cl.
CPC ..... *H03H 11/1291* (2013.01); *H03F 2200/144* (2013.01); *H03F 2200/213* (2013.01); *H03F 2200/378* (2013.01); *H03F 2200/408* (2013.01); *H03F 2200/411* (2013.01); *H03F 2200/435* (2013.01); *H03F 2200/451* (2013.01); *H03F 2203/45136* (2013.01); *H03F 2203/45522* (2013.01); *H03F 2203/5006* (2013.01); *H03F 2203/5021* (2013.01); *H03F 2203/5024* (2013.01); *H03F 2203/5031* (2013.01); *H03F 2203/5036* (2013.01); *H03F 2203/5039* (2013.01)

(56) References Cited

U.S. PATENT DOCUMENTS

| | | | | |
|---|---|---|---|---|
| 4,028,612 | A | * | 6/1977 | Orlando .................. 323/289 |
| 4,146,846 | A | | 3/1979 | Thomas et al. |
| 4,326,172 | A | * | 4/1982 | Schmidt .................. 330/294 |
| 4,340,868 | A | | 7/1982 | Pace |
| 4,464,630 | A | | 8/1984 | Eddins |
| 4,575,650 | A | * | 3/1986 | Naimpally et al. .......... 327/311 |
| 5,204,639 | A | | 4/1993 | Moore et al. |
| 5,574,398 | A | | 11/1996 | Hagino et al. |
| 5,760,641 | A | * | 6/1998 | Granger-Jones et al. ..... 327/553 |
| 6,915,121 | B2 | | 7/2005 | Python et al. |
| 7,026,870 | B2 | * | 4/2006 | Nakamura et al. .......... 330/85 |
| 2002/0050863 | A1 | | 5/2002 | Forbes |
| 2004/0063415 | A1 | | 4/2004 | Python et al. |

FOREIGN PATENT DOCUMENTS

| | | |
|---|---|---|
| GB | 2298982 A | 9/1996 |
| WO | 2005/081402 A1 | 9/2005 |

* cited by examiner

TUNABLE RF FILTER

The present invention relates to tunable radio frequency (RF) filters, including tracking filters, and circuits therefor. The present invention is particularly suited to, but not limited to, tunable RF filters for incorporation in wideband receivers, for example tuner circuits for VHF and UHF channels of television signals.

Conventional tunable RF filters, including tracking filters, typically use discrete components. The discrete components include varactors, inductors, capacitors and/or switchable diodes.

A filter design using two differential amplifiers, more particularly operational transconductance amplifiers (OTAs), is described in R. L. Geiger and E. Sánchez-Sinencio, "Active Filter Design Using Operational Transconductance Amplifiers: A Tutorial," IEEE Circuits and Devices Magazine, Vol. 1, pp. 20-32, March 1985.

U.S. Pat. No. 6,915,121 describes a corresponding tunable RF filter circuit in which transistors are used to implement the differential amplifiers, i.e. the tunable RF filter circuit of U.S. Pat. No. 6,915,121 includes two differential pairs of transistors.

The present inventors have realised it would be desirable to provide a transistor based tunable RF filter circuit that does not use differential amplifiers or differential pairs of transistors. The present inventors have realised that such a circuit would tend to suffer less noise than ones with differential amplifiers, especially ones with differential pairs of transistors. The present inventors have further realised that a limitation of known filter circuits such as those mentioned above is that such filters tend to suffer from non-linearity with respect to varying input voltage level, and that consequently it would be desirable to provide a tunable RF filter circuit design with improved linearity in terms of gain as a function of input voltage signal level, i.e. it would be desirable to provide a tunable RF filter circuit design with "in-built" automatic gain control functionality.

In a first aspect, the present invention provides a tunable RF filter, comprising: an emitter follower stage; and a common emitter stage; wherein the common emitter stage is arranged to provide feedback to the emitter follower stage.

The common emitter stage may comprise a first transistor, the first transistor being the only transistor of the common emitter stage.

The emitter follower stage may comprise a second transistor, the second transistor being the only transistor of the emitter follower stage.

The feedback may be provided from the collector terminal of the first transistor to the base terminal of the second transistor.

An output derived from the emitter terminal of the second transistor may be provided to the base terminal of the first transistor.

The base terminal of the second transistor may be connected via a first capacitor to a voltage signal input terminal, the emitter terminal of the first transistor may be connected to ground via a first resistor, and the emitter terminal of the second transistor may be connected to ground via a second resistor and a second capacitor in series, and one or more of the first resistor, the second resistor, the first capacitor and the second capacitor may be a variable value component.

In a further aspect, the present invention provides a tunable RF filter, comprising: an emitter follower stage; a joint common emitter and emitter follower stage; and a gain stage; wherein a common emitter output of the joint common emitter and emitter follower stage is arranged to provide feedback to the emitter follower stage, and an emitter follower output of the joint common emitter and emitter follower stage is arranged to provide an input to the gain stage.

The joint common emitter and emitter follower stage may comprise a first transistor, the first transistor being the only transistor of the joint common emitter and emitter follower stage.

The emitter follower stage may comprise a second transistor, the second transistor being the only transistor of the emitter follower stage.

The feedback may be provided from the collector terminal of the first transistor to the base terminal of the second transistor.

An output derived from the emitter terminal of the second transistor may be provided to the base terminal of the first transistor.

The base terminal of the second transistor may be connected via a first capacitor to a voltage signal input terminal, the emitter terminal of the first transistor may be connected to the gain stage via a first resistor, and the emitter terminal of the second transistor may be connected to ground via a second resistor and a second capacitor in series, and one or more of the first resistor, the second resistor, the first capacitor and the second capacitor may be a variable value component.

The gain stage may further comprise a fine gain tuning functionality.

The fine gain tuning functionality may comprise a variable value resistor.

Embodiments of the present invention will now be described, by way of example, with reference to the accompanying drawings, in which.

Figure 1:
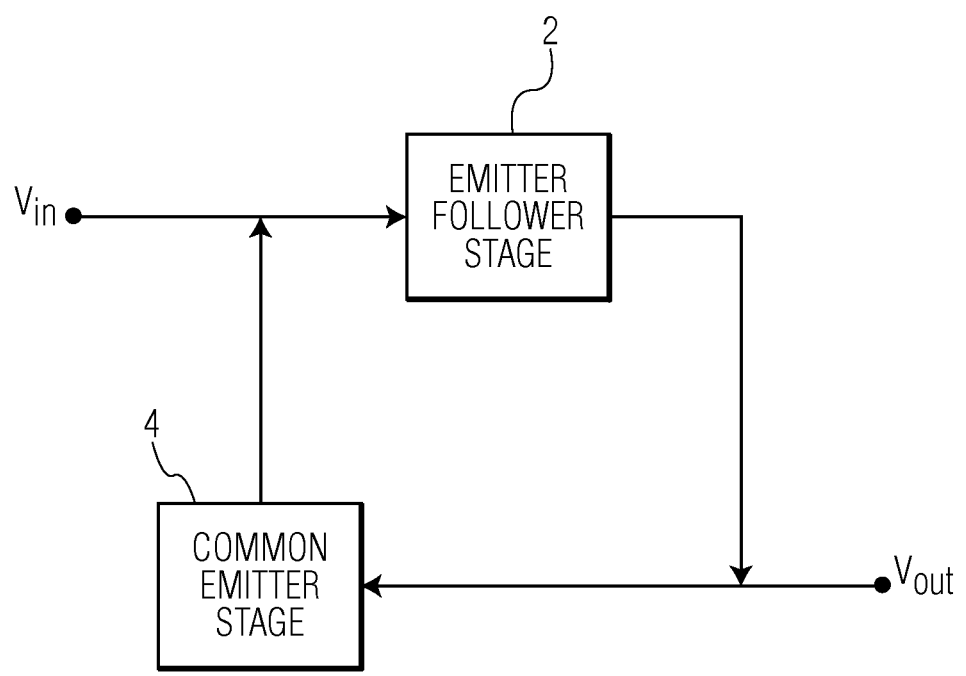
FIG. 1 is a block diagram of a tunable RF filter.

FIG. 1 is a block diagram of a tunable RF filter 1, which may be referred to as a tracking filter, according to a first embodiment. The tunable RF filter 1 comprises an emitter follower stage 2 and a common emitter stage 4. An input RF signal $V_{in}$ is coupled to the input of the emitter follower stage 2. The output of the emitter follower stage 2 provides the output signal $V_{out}$ of the tunable RF filter 1. The output of the emitter follower stage 2 is also provided as an input to the common emitter stage 4. The output of the common emitter stage 4 is coupled to the input of the emitter follower stage 2, i.e. is added to the input RF signal $V_{in}$ to provide a combined input to the emitter follower stage 2. Thus, in operation, the common emitter stage 4 provides a form of feedback to the emitter follower stage 2.

Further details of the tunable RF filter 1 will now be described with reference to FIG. 2, which is a circuit diagram of a particular tunable RF filter circuit 11 implementing, according to this embodiment, the tunable RF filter 1 of FIG. 1.

The tunable RF filter circuit 11 comprises only two transistors, namely $T_1$ and $T_2$. In this embodiment the transistors $T_1$ and $T_2$ are bipolar transistors. However, in other embodiments, other types of transistors may be used, for example MOS transistors.

Transistor $T_2$ is arranged as an emitter follower, as follows. The collector terminal of transistor $T_2$ is connected to voltage Vcc, which is the power supply voltage for the tunable RF filter circuit 11. The base terminal of transistor $T_2$ is connected to a variable capacitor $C_1$ and also to the collector terminal of transistor $T_1$. The emitter terminal of transistor $T_2$ is connected to a variable resistor $R_2$ and also to a current source $CS_2$ delivering a current of value $I_2$.

The other connection of the current source $CS_2$ is connected to ground. The other connection of the variable capacitor $C_1$ is connected to $V_{in}$, the input RF signal voltage. The other connection of the variable resistor $R_2$ is connected to a further variable capacitor $C_2$ and to the input of a unity gain amplifier $A_2$. The other connection of the variable capacitor $C_2$ is connected to ground. The output of the amplifier $A_2$ provides $V_{out}$, the output signal voltage.

Transistor $T_1$ is arranged as a common emitter, as follows. The output of amplifier $A_2$ is also connected to the base terminal of transistor $T_1$. As well as the above mentioned connection of the collector terminal of transistor $T_1$ to the base terminal of $T_2$, the collector terminal of transistor $T_1$ is also connected to an impedance $Z_H$. The emitter terminal of $T_1$ is connected to a variable resistor $R_1$ and also to a current source $CS_1$ delivering a current of value $I_1$.

The other connection of the current source $CS_1$ is connected to ground. The other connection of the variable resistor $R_1$ is connected to a capacitor $C_c$. The other connection of the capacitor $C_c$ is connected to ground. The other connection of the impedance $Z_H$ is connected to Vcc. The impedance $Z_H$ is of high impedance, and may be considered as constituted by a frequency dependent inductor L in series with a substantially frequency-independent impedance $Z_B$, and operates as a current source.

In this embodiment, the transistor $T_2$, the variable resistor $R_2$, the current source $CS_2$, the variable capacitor $C_2$ and the unity gain amplifier $A_2$ together constitute an emitter follower stage 2 corresponding to the emitter follower stage 2 of FIG. 1; and the transistor $T_1$, the current source $CS_1$, the variable resistor $R_1$ and the capacitor $C_c$ together constitute a common emitter stage 4 corresponding to the common emitter stage 4 of FIG. 1.

In operation the collector terminal of transistor $T_1$ provides an output of the common emitter stage 4, and this output is coupled to the input of the emitter follower stage 2, i.e. the base terminal of $T_2$, moreover being added to the input RF signal $V_{in}$ to provide a combined input to the emitter follower stage 2. Thus, in operation, the common emitter stage 4 provides a form of feedback to the emitter follower stage 2.

The unity gain amplifier $A_2$ serves to provide impedance matching for the output signal voltage $V_{out}$.

The variable resistors $R_1$ and $R_2$ may perform various functions. Firstly they increase the linearity of their respective stage. Secondly, along with the variable capacitors $C_1$ and $C_2$, they may be used to control operating parameters such as central frequency, as will be described in more detail below.

The above described tunable RF filter circuit 11 provides various advantages over prior art circuits. For example, the tunable RF filter circuit 11 provides a transistor based tunable RF filter circuit that does not use differential amplifiers or differential pairs of transistors. The tunable RF filter circuit 11 therefore tends to suffer less noise than prior art ones with differential amplifiers, especially ones with differential pairs of transistors. Furthermore, the simplified design of the tunable RF filter circuit 11 (again, the use of only two transistors, and also fewer current sources) compared to prior art circuits tends to allow more efficient and cost effective manufacture, more reliable operation, and so on.

Furthermore, the design of the tunable RF filter circuit 11 allows straightforward control of various operating parameters, in particular by variation of one or more of the variable components comprising the variable resistors $R_1$ and $R_2$ and the variable capacitors $C_1$ and $C_2$. This aspect can further be appreciated from the following analysis:

The transfer function of the band pass filter is:

$$\frac{V_{out}}{V_{in}} = \frac{p \cdot \frac{gm_2}{C_2(1+gm_2R_2)}}{p^2 + p \cdot \frac{gm_2}{C_2(1+gm_2R_2)} + \frac{gm_1 gm_2}{C_1 \cdot C_2(1+gm_2R_2) \cdot (1+gm_1R_1)}} \quad (1.1)$$

where: $p = j\omega = j2\pi f$ (where f is the frequency); $gm_1$ is the transconductance gain of the common emitter stage 4; and $gm_2$ is the transconductance gain of the emitter follower stage 2.

The central frequency $f_0$ is:

$$f_0 = \frac{1}{2 \cdot \Pi} \sqrt{\frac{gm_1 gm_2}{(1+gm_2R_2) \cdot (1+gm_1R_1) \cdot C_1 \cdot C_2}} \quad (1.2)$$

The quality factor Q is:

$$Q = \sqrt{\frac{gm_1 \cdot (1+gm_2R_2) \cdot C_2}{gm_2 \cdot (1+gm_1R_1) \cdot C_1}} \quad (1.3)$$

The bandwidth B is:

$$B = \frac{1}{2 \cdot \Pi} \frac{gm_2}{C_2(1+gm_2R_2)} \quad (1.4)$$

The input impedance $Z_{in}$ at resonance is:

$$Z_{in} = \frac{1}{C_1 \cdot \omega \cdot Q} \quad (1.5)$$

The transfer function between $V_1$ (the voltage at the base terminal of transistor $T_2$) and $V_{in}$ at resonance is:

$$\frac{V_1}{V_{in}}\bigg|_{w=w_0} = 1 + jQ \quad (1.6)$$

Thus equation 1.2 shows how the central frequency $f_0$ can be varied by varying one or more of $C_1$, $C_2$, $R_1$ and $R_2$; equation 1.3 shows how the quality factor Q can be varied by varying one or more of $C_1$, $C_2$, $R_1$ and $R_2$; equation 1.4 shows how the bandwidth B can be varied by varying one or more of $C_2$ and $R_2$; and equation 1.5 shows how the input impedance $Z_{in}$ can be varied by varying $C_1$.

As well as recognising the above described advantages and possibilities of the first embodiment, the present inventors have further realised a disadvantage of the first embodiment and have also realised that this disadvantage is also exhibited by prior art circuits. The disadvantage, which the inventors have realised is indicated in equation 1.6, is that the gain between $V_1$ and $V_{in}$ is proportional to the quality factor Q, hence increasing the quality factor Q increases the gain at the input of transistor $T_2$. Consequently, (as is also the case with prior art circuits) the RF filter circuit 11 displays non-linear gain with respect to the level of the input RF signal voltage $V_{in}$, in particular for high levels of $V_{in}$.

Based on this realisation the present inventors have provided a second embodiment of the invention which addresses this non-linear issue, and which will now be described with reference to FIGS. 3 and 4.

Figure 3:
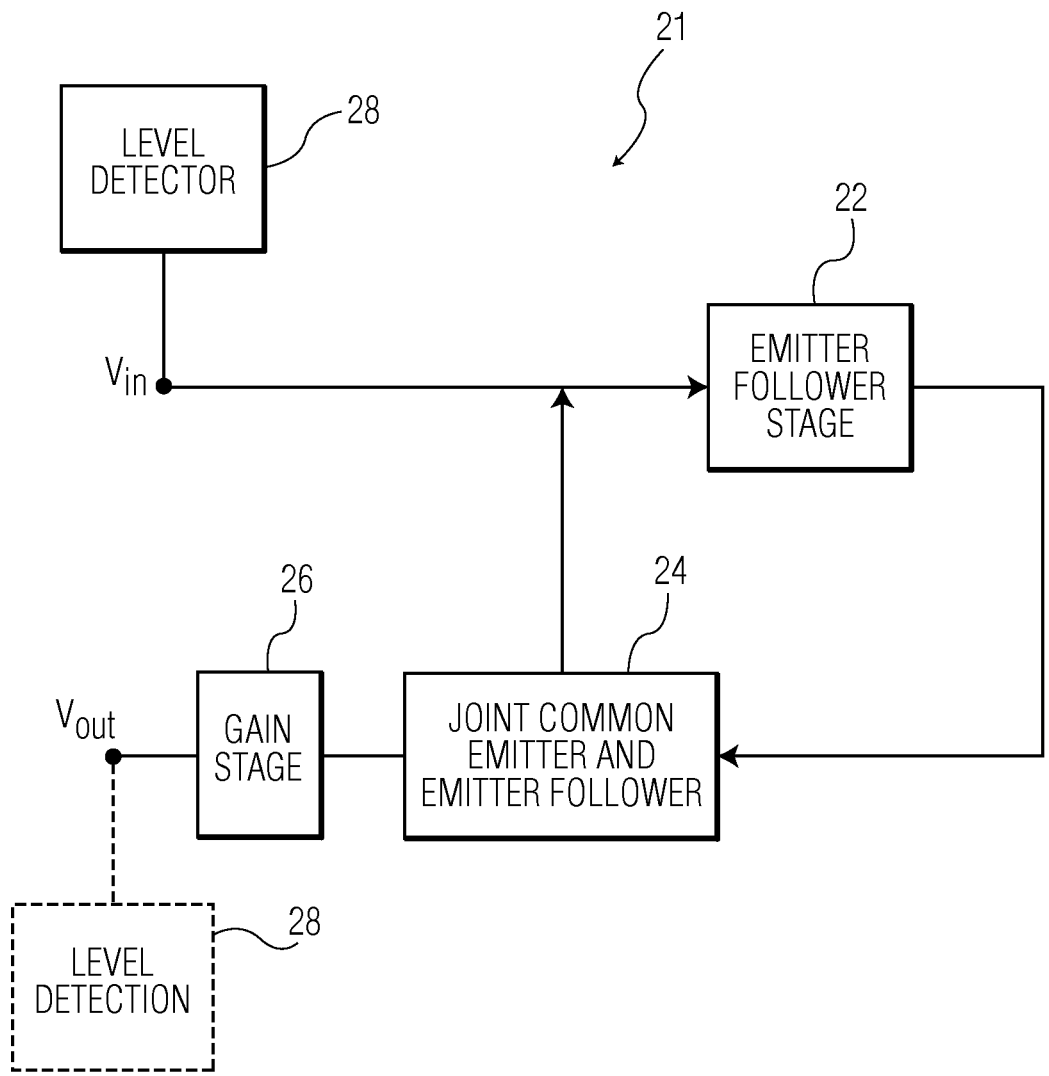
FIG. 3 is a block diagram of a further tunable RF filter.

FIG. 3 is a block diagram of a tunable RF filter 21, which may be referred to as a tracking filter, according to the second embodiment. The tunable RF filter 1 comprises an emitter follower stage 22 and a joint common emitter and emitter follower stage 24. An input RF signal $V_{in}$ is coupled to the input of the emitter follower stage 22. The output of the emitter follower stage 22 is provided as an input to the joint common emitter and emitter follower stage 24. A first output of the joint common emitter and emitter follower stage 24 is coupled to the input of the emitter follower stage 22, i.e. is added to the input RF signal $V_{in}$ to provide a combined input to the emitter follower stage 22. Thus, in operation, the joint common emitter and emitter follower stage 24 provides a form of feedback to the emitter follower stage 22.

A second output of the joint common emitter and emitter follower stage 24 is provided as an input to a gain stage 26. In this embodiment the gain stage 26 is a fine tune and gain stage 26. The output of the fine tune and gain stage 26 provides the output signal $V_{out}$ of the tunable RF filter 1.

In this embodiment, a conventional level detector 28 is coupled to $V_{in}$ for detecting the signal level of $V_{in}$. In other embodiments, the level detector 28 is instead coupled to $V_{out}$ for detecting the signal level of $V_{out}$, this latter alternative being indicated in FIG. 3 by a dotted line representation of the level detector 28.

Further details of the tunable RF filter 21 will now be described with reference to FIG. 4, which is a circuit diagram of a particular tunable RF filter circuit 31 implementing, according to this embodiment, the tunable RF filter 21 of FIG. 3.

The tunable RF filter circuit 31 comprises only two transistors, namely $T_1$ and $T_2$. In this embodiment the transistors $T_1$ and $T_2$ are bipolar transistors. However, in other embodiments, other types of transistors may be used, for example MOS transistors.

Transistor $T_2$ is arranged as an emitter follower, as follows. The collector terminal of transistor $T_2$ is connected to voltage Vcc, which is the power supply voltage for the tunable RF filter circuit 31. The base terminal of transistor $T_2$ is connected to a variable capacitor $C_1$ and also to the collector terminal of transistor $T_1$. The emitter terminal of transistor $T_2$ is connected to a variable resistor $R_2$ and also to a current source $CS_2$ delivering a current of value $I_2$.

The other connection of the current source $CS_2$ is connected to ground. The other connection of the variable capacitor $C_1$ is connected to $V_{in}$, the input RF signal voltage. The other connection of the variable resistor $R_2$ is connected to a further variable capacitor $C_2$. The other connection of the variable capacitor $C_2$ is connected to ground.

Transistor $T_1$ is arranged both as a common emitter and as an emitter follower, as follows. The above mentioned other connection of the variable resistor $R_2$, is also connected to the base terminal of transistor $T_1$. As well as the above mentioned connection of the collector terminal of transistor $T_1$ to the base terminal of $T_2$, the collector terminal of transistor $T_1$ is also connected to an impedance $Z_H$. The emitter terminal of $T_1$ is connected to a variable resistor $R_1$ and also to a current source $CS_1$ delivering a current of value $I_1$.

The other connection of the current source $CS_1$ is connected to ground. The other connection of the variable resistor $R_1$ is connected to a capacitor $C_c$. The other connection of the impedance $Z_H$ is connected to Vcc. The impedance $Z_H$ is of high impedance, and may be considered as constituted by a frequency dependent inductor L in series with a substantially frequency-independent impedance $Z_B$, and operates as a current source.

The tunable RF filter circuit 31 further comprises an amplifier $A_3$ and a further variable resistor $R_f$. The negative input terminal of the amplifier $A_3$ is connected to the other connection of the capacitor $C_c$. The positive input terminal of the amplifier $A_3$ is connected to ground. The variable resistor $R_f$ is connected across the amplifier $A_3$, i.e. is connected between the negative input terminal of the amplifier $A_3$ and the output terminal of the amplifier $A_3$.

The output of the amplifier $A_3$ provides $V_{out}$, the output signal voltage.

A level detector 28 may be connected to $V_{in}$. Another possibility is for the level detector 28 to be connected to $V_{out}$, this latter possibility being indicated in FIG. 4 by a dotted line representation of the level detector 28.

In this embodiment, the transistor $T_2$, the variable resistor $R_2$, the current source $CS_2$, and the variable capacitor $C_2$ together constitute an emitter follower stage 22 corresponding to the emitter follower stage 22 of FIG. 3; the transistor $T_1$, the current source $CS_1$, the variable resistor $R_1$ and the capacitor $C_c$ together constitute a joint common emitter and emitter follower stage 24 corresponding to the joint common emitter and emitter follower stage 24 of FIG. 3; and the amplifier $A_3$ and variable resistor $R_f$ together constitute a fine-tune and gain stage 26 corresponding to the fine tune and gain stage 26 of FIG. 3.

In operation the collector terminal of transistor $T_1$ provides an output of the common emitter function of the joint common emitter and emitter follower stage 4, and this output is coupled to the input of the emitter follower stage 2, i.e. the base terminal of $T_2$, moreover being added to the input RF signal $V_{in}$ to provide a combined input to the emitter follower stage 2. Thus, in operation, the common emitter stage 4 provides a form of feedback to the emitter follower stage 2.

Furthermore, in operation the emitter terminal of transistor $T_1$ provides an output of the emitter follower function of the joint common emitter and emitter follower stage 4. This output provides an input signal to the fine tune and gain stage 26. The fine tune and gain stage amplifies the signal to provide $V_{out}$, the output signal voltage.

The variable resistor $R_f$ provides fine tuning of the gain of the amplifier $A_3$, and hence fine-tuning of automatic gain control functionality performed by the tunable RF filter circuit 31 (the automatic gain control functionality will be described in more detail below).

The variable resistors $R_1$ and $R_2$ may perform various functions. Firstly they increase the linearity of their respective stage. Secondly, along with the variable capacitors $C_1$ and $C_2$, they may be used to control operating parameters such as central frequency, along the lines described above in relation to FIGS. 1 and 2. In this embodiment, $R_1$ additionally plays a role in the automatic gain control functionality performed by the tunable RF filter circuit 31.

The above described tunable RF filter circuit 31 provides various advantages over prior art circuits. For example, the tunable RF filter circuit 31 provides a transistor based tunable RF filter circuit that does not use differential amplifiers or differential pairs of transistors. The tunable RF filter circuit 31 therefore tends to suffer less noise than prior art ones with differential amplifiers, especially ones with differential pairs of transistors. Furthermore, the simplified design of the tunable RF filter circuit 31 (again, the use of only two transistors, and also fewer current sources) compared to prior art circuits tends to allow more efficient and cost effective manufacture, more reliable operation, and so on.

Furthermore, the design of the tunable RF filter circuit 31 allows straightforward control of various operating parameters, in particular by variation of one or more of the variable components comprising the variable resistors $R_f$, $R_1$ and $R_2$ and the variable capacitors $C_1$ and $C_2$. This aspect can further be appreciated from analysis that will be presented below in relation to the automatic gain control functionality performed by the tunable RF filter circuit 31, and also from the analysis described above for the tunable RF filter circuit 11 of FIG. 2.

Figure 2:
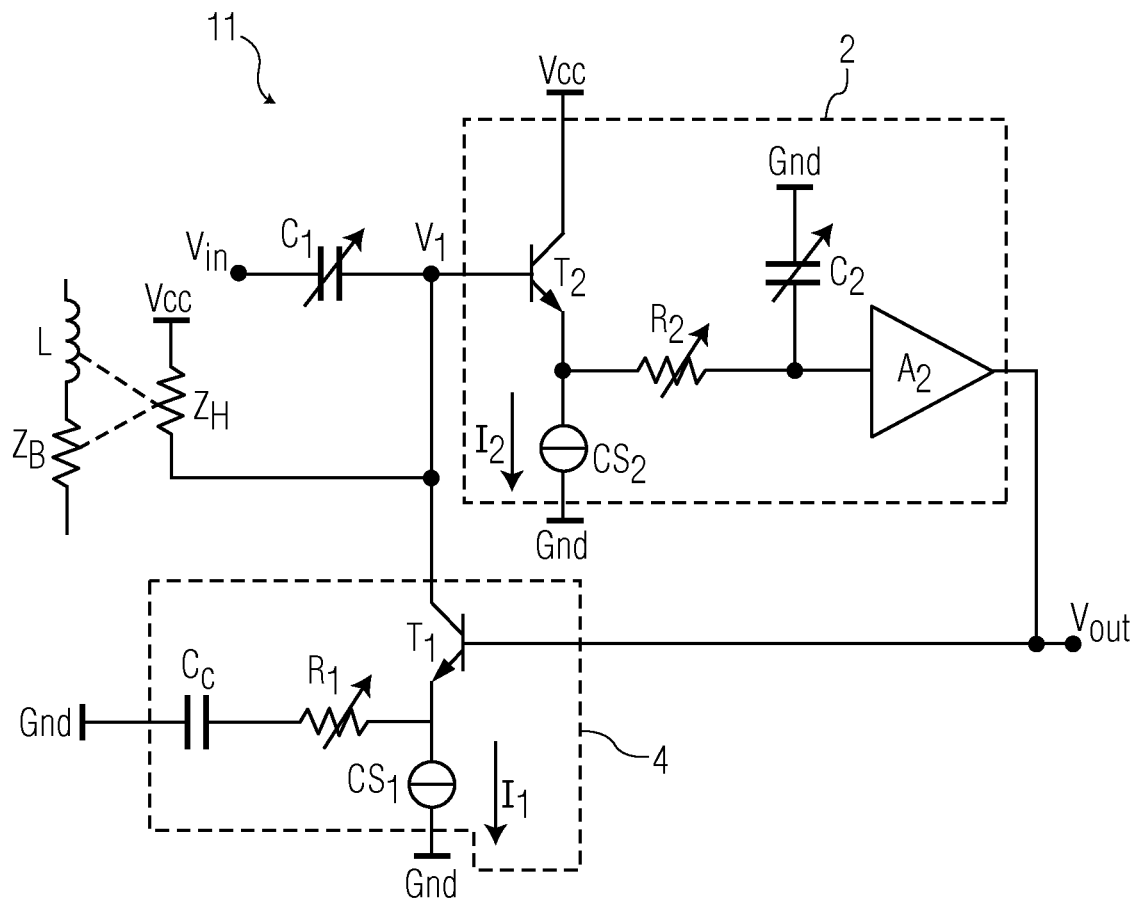
FIG. 2 is a circuit diagram of a particular tunable RF filter circuit implementing the tunable RF filter of FIG. 1.
Figure 4:
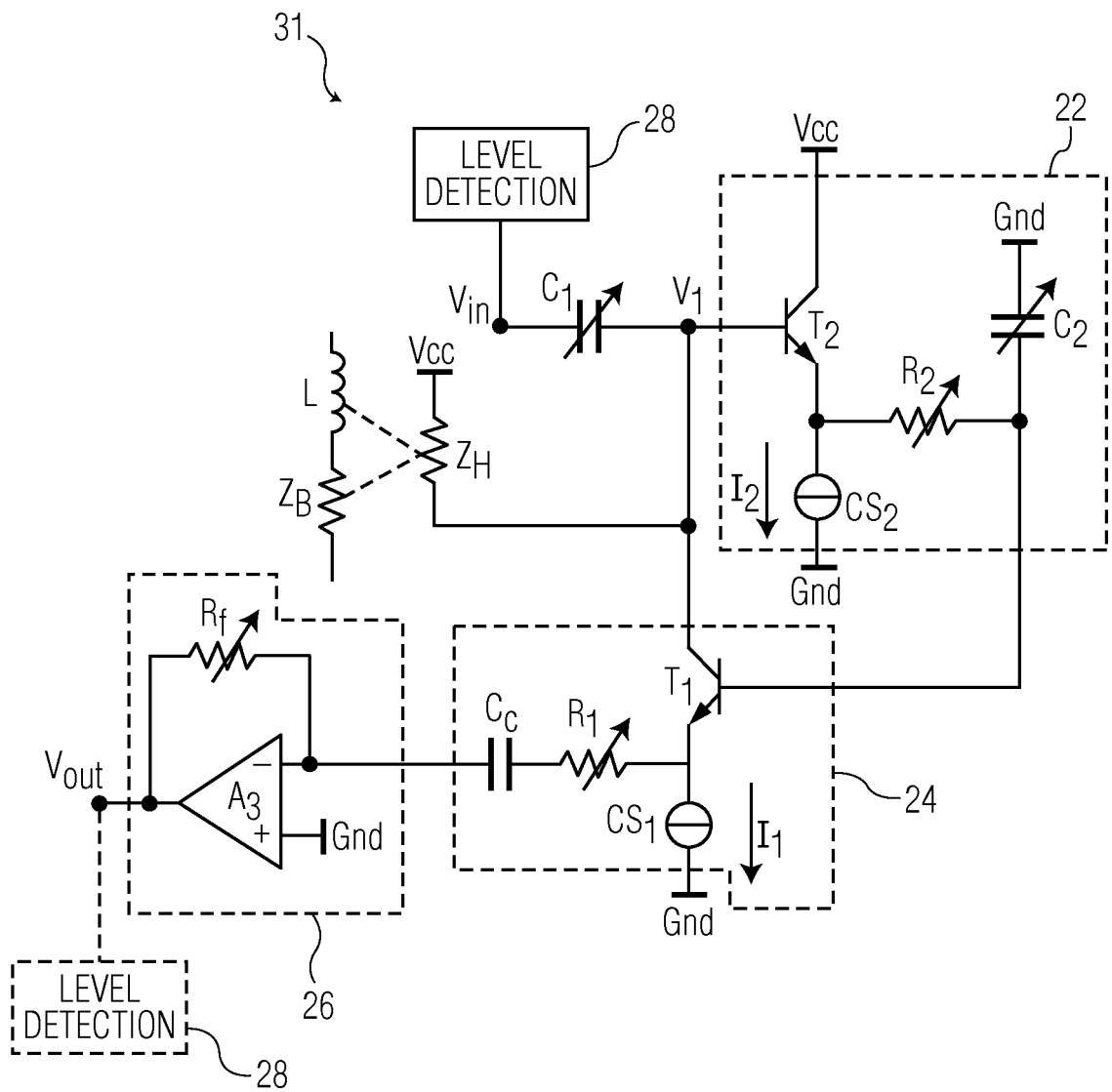
FIG. 4 is a circuit diagram of a particular tunable RF filter circuit implementing the tunable RF filter of FIG. 3.

In addition to the above described advantages which are shared with the tunable RF filter circuit 11 of FIG. 2, the tunable RF filter circuit 31 of FIG. 4 further performs a form of automatic gain control that alleviates the above described disadvantage of non-linear gain. This aspect can further be appreciated from the following analysis:

The transfer function of the tunable RF filter circuit 31, with gain control, is:

$$\frac{V_{out}}{V_{in}} = -\frac{Rf}{R_1} \cdot \frac{gm_1 R_1}{(1+gm_1 R_1)} \cdot \frac{p \cdot \frac{gm_2}{C_2(1+gm_2 R_2)}}{p^2 + p \cdot \frac{gm_2}{C_2(1+gm_2 R_2)} + \frac{gm_1 gm_2}{C_1 \cdot C_2 \cdot (1+gm_2 R_2) \cdot (1+gm_1 R_1)}} \quad (1.7)$$

When $gm_1=gm_2$, $gm_1 R_1 \gg 1$, and $gm_2 R_2 \gg 1$, then:
The transfer function becomes:

$$\frac{V_{out}}{V_{in}} = -\frac{Rf}{R_1} \cdot \frac{p \cdot \frac{1}{C_2 R_2}}{p^2 + p \cdot \frac{1}{C_2 R_2} + \frac{1}{C_1 \cdot C_2 \cdot R_2 \cdot R_1}} \quad (1.8)$$

The central frequency $f_0$ becomes:

$$f_0 = \frac{1}{2 \cdot \Pi} \sqrt{\frac{1}{R_2 \cdot R_1 \cdot C_1 \cdot C_2}} \quad (1.9)$$

The quality factor Q becomes:

$$Q = \sqrt{\frac{R_2 \cdot C_2}{R_1 \cdot C_1}} \quad (1.10)$$

The bandwidth B becomes:

$$B = \frac{1}{2 \cdot \Pi} \frac{1}{C_2 R_2} \quad (1.11)$$

It will be appreciated from the above that the quality factor Q and the gain at the output of the tunable RF filter circuit 31 depend on the value of the variable resistor $R_1$, i.e. the gain and the Q are maximum when $R_1$ is minimum. In this embodiment the coarse step of the gain is controlled by setting the value of variable resistor $R_1$ and the fine step of the gain is controlled by setting the value of the variable resistor $R_f$. (Note, however, that in other embodiments where coarse gain control suffices, the variable resistor $R_f$ may be omitted).

It is therefore possible to control the tunable RF filter circuit 31 such as to vary the quality factor as a function of the level of the input RF signal voltage level $V_{in}$. This therefore provides a form of integrated automatic gain control (AGC). Such implementation of AGC allows optimisation of the linearity, the output noise and the quality factor as a function of the input voltage level $V_{in}$. This is performed by using the level detector 28 at the input of the band pass filter, so when the input level is low the gain and quality factor is increased by decreasing $R_1$ allowing a low output noise, the linearity at the output is sufficient (gain is high). When the input level is high the gain and quality factor are decreased by increasing $R_1$, which improves the linearity and the output noise is moderate (gain is low). The level detector 28 may be any suitable level detector. In this example, the level detector 28 is a signal peak detector. Also, in other embodiments, the level detector may be connected to the output of the tunable RF filter circuit 31 rather than the input.

Thus the tunable RF filter circuit 31 provides combined AGC and tracking filter functionality. This advantageously tends to provide a reduction in noise compared to if a conventional AGC circuit was simply juxtaposed with a conventional tunable filter circuit, since for example the variable resistor $R_1$ is shared by the AGC functionality and the tracking filter functionality of the tunable RF filter circuit 31.

Referring to equation 1.9 above, it will be appreciated that changing the value of the variable resistor $R_1$ will change the central frequency $f_0$. The central frequency $f_0$ can also or alternatively be adjusted by simply changing $R_2$ at the same time. The filter can further be tuned by adjusting the values of either or both of the variable capacitors $C_1$ and $C_2$. Indeed, it will be appreciated from equations 1.9 and 1.10 that both or either of the central frequency f0 and the quality factor Q may be controlled or varied by varying any one or more of $R_1$, $R_2$, $C_1$ and $C_2$. Hence, although optimum flexibility is provided by having each of $R_1$, $R_2$, $C_1$ and $C_2$ as variable components as in the above described embodiment, nevertheless in other embodiments any one, two or three of these components may be implemented as fixed value components in the interests of simplicity or for any other reason.

A further advantage of the tunable RF filter circuit 31 is that due to the low output impedance of the fine tune and gain stage 26, there is no need for a separate impedance matching amplifier at the output, such as the unity gain amplifier $A_2$ of the circuit described above with reference to FIG. 2.

Yet a further advantage is that the tunable RF filter circuit 31 may be manufactured in an integrated form without any external components.

In the embodiments described above with reference to FIGS. 1 to 4, a further option is to further providing a conventional linearity compensation loop as part of the emitter follower stage, to further improve the linearity of the emitter follower stage.

As described above, a first embodiment of a tunable RF filter as shown in FIG. 1 is implemented by the particular embodiment of a tunable RF filter circuit as shown in FIG. 2; and similarly a second embodiment of a tunable RF filter as shown in FIG. 3 is implemented by the particular embodiment of a tunable RF filter circuit as shown in FIG. 4. However, it will be appreciated that each of the first and second embodiments of a tunable RF filter (as shown in FIGS. 1 and 3) may be implemented by circuit designs (and including different components) other than the respective particular embodiments of tunable RF filter circuits shown in FIGS. 2 and 4 respectively.

The invention claimed is:

1. A tunable RF filter having an output, comprising:
an emitter follower stage; and
a common emitter stage;
wherein the common emitter stage is arranged to directly provide feedback to the emitter follower stage; and
characterized in that an output of the emitter follower stage provides the output of the tunable RF filter.

2. A tunable RF filter according to claim 1, wherein the common emitter stage comprises a first transistor, the first transistor being the only transistor of the common emitter stage; and
the emitter follower stage comprises a second transistor, the second transistor being the only transistor of the emitter follower stage.

3. A tunable RF filter according to claim 2, wherein the feedback is directly provided from the collector terminal of the first transistor to the base terminal of the second transistor.

4. A tunable RF filter according to claim 3, wherein an output derived from the emitter terminal of the second transistor is provided to the base terminal of the first transistor.

5. A tunable RF filter according to claim 4, wherein the base terminal of the second transistor is connected via a first capacitor to a voltage signal input terminal, the emitter terminal of the first transistor is connected to ground via a first resistor, and the emitter terminal of the second transistor is connected to ground via a second resistor and a second capacitor in series, and wherein one or more of the first resistor, the second resistor, the first capacitor and the second capacitor is a variable value component.

6. A tunable RF filter having an output, comprising:
an emitter follower stage;
a joint common emitter and emitter follower stage; and
a gain stage;
wherein a common emitter output of the joint common emitter and emitter follower stage is arranged to directly provide feedback to the emitter follower stage, and an emitter follower output of the joint common emitter and emitter follower stage is arranged to provide an input to the gain stage; and
characterized in that an output of the gain stage provides the output of the tunable RF filter.

7. A tunable RF filter according to claim 6, wherein the joint common emitter and emitter follower stage comprises a first transistor, the first transistor being the only transistor of the joint common emitter and emitter follower stage; and
the emitter follower stage comprises a second transistor, the second transistor being the only transistor of the emitter follower stage.

8. A tunable RF filter according to claim 7, wherein the feedback is directly provided from the collector terminal of the first transistor to the base terminal of the second transistor.

9. A tunable RF filter according to claim 8, wherein an output derived from the emitter terminal of the second transistor is provided to the base terminal of the first transistor.

10. A tunable RF filter according to claim 9, wherein the base terminal of the second transistor is connected via a first capacitor to a voltage signal input terminal, the emitter terminal of the first transistor is connected to the gain stage via a first resistor, and the emitter terminal of the second transistor is connected to ground via a second resistor and a second capacitor in series, and wherein one or more of the first resistor, the second resistor, the first capacitor and the second capacitor is a variable value component.

11. A tunable RF filter according to claim 10, wherein the gain stage further comprises a fine gain tuning functionality.

12. A tunable RF filter according to claim 11, wherein the fine gain tuning functionality comprises a variable value resistor.

* * * * *